United States Patent
Sharma et al.

(10) Patent No.: US 10,741,261 B1
(45) Date of Patent: Aug. 11, 2020

(54) METHOD AND SYSTEM FOR IMPROVING PERFORMANCE OF A STORAGE DEVICE USING ASYNCHRONOUS INDEPENDENT PLANE READ FUNCTIONALITY

(71) Applicant: WESTERN DIGITAL TECHNOLOGIES, INC., San Jose, CA (US)

(72) Inventors: Sahil Sharma, San Jose, CA (US); Phil Reusswig, Mountain View, CA (US); Rohit Sehgal, San Jose, CA (US); Niles Yang, Mountain View, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/863,417

(22) Filed: Apr. 30, 2020

Related U.S. Application Data

(63) Continuation of application No. 16/256,010, filed on Jan. 24, 2019.

(51) Int. Cl.
| | |
|---|---|
| *G11C 7/00* | (2006.01) |
| *G11C 16/32* | (2006.01) |
| *G11C 16/28* | (2006.01) |
| *G11C 7/10* | (2006.01) |
| *G11C 7/06* | (2006.01) |
| *G11C 16/04* | (2006.01) |
| *G11C 11/56* | (2006.01) |

(52) U.S. Cl.
CPC ............... *G11C 16/32* (2013.01); *G11C 7/06* (2013.01); *G11C 7/1066* (2013.01); *G11C 11/5635* (2013.01); *G11C 16/0483* (2013.01); *G11C 16/28* (2013.01)

(58) Field of Classification Search
CPC .. G11C 7/00; G11C 16/32; G11C 7/06; G11C 7/1066; G11C 11/5635; G11C 16/0483; G11C 16/28
USPC ........................................ 365/185.01–185.33
See application file for complete search history.

(56) References Cited

U.S. PATENT DOCUMENTS

| | | | | |
|---|---|---|---|---|
| 8,537,621 B2 * | 9/2013 | Lee | ..................... | G11C 16/0483 365/185.21 |
| 8,717,822 B2 * | 5/2014 | Lee | ........................ | G11C 16/26 365/185.21 |
| 2014/0010021 A1 * | 1/2014 | Lee | ..................... | G11C 16/0483 365/185.18 |

* cited by examiner

*Primary Examiner* — Harry W Byrne
(74) *Attorney, Agent, or Firm* — Morgan, Lewis & Bockius LLP

(57) ABSTRACT

In one embodiment there is a method for calculating a timer at a storage device including a plurality of memory portions for storing data and a memory controller for performing operations on the memory portions, the method comprises receiving a request to perform an initial operation on a memory portion; determining an operational characteristic associated with the initial operation to be performed on the memory portion; and calculating an amount of time for a memory portion timer based on the operational characteristics before the initiation of the initial operation on the memory portion, wherein performance of a subsequent operation for another memory portion is delayed until the amount of time for the memory portion timer has elapsed since initiation of the operation on the memory portion.

13 Claims, 6 Drawing Sheets

METHOD AND SYSTEM FOR IMPROVING PERFORMANCE OF A STORAGE DEVICE USING ASYNCHRONOUS INDEPENDENT PLANE READ FUNCTIONALITY

CROSS-REFERENCE TO RELATED APPLICATIONS

This application is a continuation of U.S. patent application Ser. No. 16/256,010 filed on Jan. 24, 2019, "Method And System For Improving Performance Of A Storage Device Using Asynchronous Independent Plane Read Functionality," which is incorporated herein by reference in its entirety.

BACKGROUND

Semiconductor memory devices, including flash memory, and controllers thereof typically utilize memory cells to store data as an electrical value, such as an electrical charge or voltage. A memory cell, for example, includes a single transistor with a floating gate that is used to store a charge representative of a data value. Memory is a non-volatile data storage device that can be electrically erased and reprogrammed. More generally, non-volatile memory (e.g., flash memory, as well as other types of non-volatile memory implemented using any of a variety of technologies) retains stored information even without power, as opposed to volatile memory, which requires power to maintain the stored information.

The semiconductor memory devices may be configured to include one or more die. Each die may be organized into one or more planes. Each plane may be a two dimensional grid composed of rows (bitlines) and columns (wordlines) that connect to the memory cells. The individual rows that make up the grid may be referred as a page. Common page sizes may include 2K, 4K, 8K, or 16K.

The semiconductor memory devices may be configured to conduct a 4K random read which involves sensing (e.g., reading) each plane with a different random page. In this configuration, each plane can be representative of an independent die, thereby increasing the system parallelism for plane reads.

Some constraints may exist for the semiconductor device to conduct independent plane reads. For example, while two planes are simultaneously sensing, there may be interference between the two planes, which may cause a high bit error rate (BER) or an unwanted spike in peak power. The increase in BER may potentially limit asynchronous independent plane read (aIPR) usage for system (e.g., read exception handling, read threshold calibration) or increase the burden on storage device engineers to meet system BER requirements. The spike in peak power may cause an undesired increase in system load, requiring the system to limit the number of die working in parallel to ensure certain power requirements. To address these issues, the semiconductor device may be configured to conduct synchronous independent plane reads, where each plane is read individually and synchronized based on a common clock signal. However, the semiconductor device may suffer from reduced performance speeds due to each plane having to wait a set predetermined amount of time for a preceding plane to completely finish a sensing operation before conducting a new sensing operation. Therefore, there is a need for an improved semiconductor devices and controllers for said semiconductor devices configured for independent plane reads with improved performance speeds while also limiting bit error rate and managing peak power and average power.

SUMMARY

Without limiting the scope of the appended claims, after considering this disclosure, and particularly after considering the section entitled "Detailed Description," one will understand how the aspects of various embodiments are implemented and used to perform independent plane reads with improved performance speeds while also limiting bit error rate and spikes in peak power and average power.

In one embodiment there is a method for implementing independent plane reads at a storage device including a plurality of memory planes for storing data and a memory controller for performing operations on the memory planes, the method comprising: at the memory controller: receiving a request to perform a first operation on a first plane; determining, for a second plane, whether a second plane timer having a respective predetermined amount of time has elapsed since initiation of a second operation being performed on the second plane, separate and distinct from the first plane; in response to a determination that the respective predetermined amount of time for the second plane timer has not elapsed, delaying performance of the first operation on the first plane until the respective predetermined amount of time associated with initiation of the second operation performed on the second plane has elapsed, and after delaying performance, performing the first operation on the first plane while the second operation continues to be performed on the second plane; and in response to a determination that the respective predetermined amount of time for the second plane timer has elapsed, performing the first operation on the first plane.

In some embodiments, the first and/or second operation is a sensing operation.

In some embodiments, the respective predetermined amount of time for the second plane timer is based on respective characteristics of the memory and/or sensing operation.

In some embodiments, the respective characteristic is at least one of: memory characteristics, page combination characteristics and sensing operation characteristics of the respective plane.

In some embodiments, the method further comprising: at the memory controller: in response to initiating performance of the first operation on the first plane, initializing a first plane timer including a respective predetermined amount of time to perform the first operation on the first plane, wherein the first sensing operation.

In some embodiments, the method further comprising: at the memory controller: in response to completion of performing the first operation on the first plane, resetting the first plane time.

In some embodiments, the respective predetermined amount of time for the first plane timer is based on a respective characteristic of the first operation being performed on the first plane.

In some embodiments, the respective predetermined amount of time for the first plane timer is different from the respective predetermine amount of time for the second plane timer.

In some embodiments, the first plane and the second plane are connected to a same power source.

In some embodiments, the first plane and the second plane are located on a same die.

In some embodiments, there is a data storage system for implementing independent plane reads, the data storage system comprising: a storage device including a plurality of memory planes for storing data; and a memory controller for performing operations on the memory planes, the memory controller configured to perform the steps of: receiving a request to perform a first operation on a first plane; determining, for a second plane, whether a second plane timer having a respective predetermined amount of time has elapsed since initiation of a second operation being performed on the second plane, separate and distinct from the first plane; in response to a determination that the respective predetermined amount of time for the second plane timer has not elapsed: delay performing the first operation on the first plane until the respective predetermined amount of time associated with initiation of the second operation performed on the second plane has elapsed, and after delaying performance, performing the first operation on the first plane while the second operation continues to be performed on the second plane; and in response to a determination that the respective predetermined amount of time for the second plane timer has elapsed, performing the first operation on the first plane.

In some embodiments, the first operation is a sensing operation.

In some embodiments, the respective predetermined amount of time for the second plane timer is based on a respective characteristic of the second operation being performed on the second plane.

In some embodiments, the respective characteristic of the second operation is at least one of: memory characteristics, page combination characteristics and sensing operation characteristics of the respective plane.

In some embodiments, the memory controller is further configured to perform the step of: in response to initiating performance of the first operation on the first plane, initializing a first plane timer including a respective predetermined amount of time to perform the first operation on the first plane, wherein the first sensing operation.

In some embodiments, the memory controller is further configured to perform the step of: in response to completion of performing the first operation on the first plane, resetting the first plane time.

In some embodiments, the respective predetermined amount of time for the first plane timer is based on a respective characteristic of the first operation being performed on the first plane.

In some embodiments, the respective predetermined amount of time for the first plane timer is different from the respective predetermine amount of time for the second plane timer.

In some embodiments, the first plane and the second plane are connected to a same power source.

In some embodiments, the first plane and the second plane are located on a same die.

In one embodiment, there is a method for calculating a timer at a storage device including a plurality of memory portions for storing data and a memory controller for performing operations on the memory portions. The method may include receiving a request to perform an initial operation on a memory portion. The method may include determining an operational characteristic associated with the initial operation to be performed on the memory portion. The method may include calculating an amount of time for a memory portion timer based on the operational characteristics before the initiation of the initial operation on the memory portion, wherein performance of a subsequent operation for another memory portion is delayed until the amount of time for the memory portion timer has elapsed since initiation of the operation on the memory portion.

In some embodiments, the operational characteristic includes at least one of: a memory characteristic, a page combination characteristic, and a sensing characteristic.

In some embodiments, the operational characteristic is a memory characteristic that includes at least one of: program/erase cycle, data retention, cross-temperature, system temperature and read-disturb.

In some embodiments, the operational characteristic is a page combination characteristic that includes at least one of: a single level cell page, multi-level cell (MLC) lower page, MLC middle page, and MLC upper page.

In some embodiments, the operational characteristic is a sensing characteristic that includes at least one of: first read, normal read, Vreak spike and data look ahead.

In some embodiments, a first time period for the performance of the initial operation on the memory portion overlaps with a second time period for the performance of a subsequent operation for another memory portion.

In some embodiments, the memory portion is at least one of: a plane, a die, a block, a page.

In one embodiment, there is memory controller for performing operations on one or more memory portions for storing data, the memory controller configured to perform the operations of: receiving a request to perform a first operation on a first memory portion; determining, for a second memory portion, whether a second memory portion timer having a respective amount of time has elapsed since initiation of a second operation being performed on the second memory portion, separate and distinct from the first memory portion; in response to a determination that the respective amount of time for the second memory portion timer has not elapsed: delay performing the first operation on the first memory portion until the respective amount of time associated with initiation of the second operation performed on the second memory portion has elapsed, and after delaying performance, performing the first operation on the first memory portion while the second operation continues to be performed on the second memory portion; and in response to a determination that the respective amount of time for the second memory portion timer has elapsed, performing the first operation on the first memory portion.

In some embodiments, the memory controller is further configured to perform the operation of: before performing the second operation on the second memory portion: determining a respective operational characteristic of the second operation to be performed on the second memory portion; and calculating the respective amount of time for the second memory portion timer based on the respective operational characteristic of the second operation to be performed on the second memory portion.

In some embodiments, the respective operational characteristic of the second operation is at least one of: memory characteristics, page combination characteristics and sensing operation characteristics of the respective memory portion.

In some embodiments, the memory controller is further configured to perform the operation of: in response to initiating performance of the first operation on the first memory portion, initializing a first memory portion timer including a respective amount of time to perform the first operation on the first memory portion.

In some embodiments, the first memory portion and the second memory portion are connected to a same power source.

In some embodiments, the memory portion is at least one of: a plane, a die, a block, and a page.

In one embodiments, there is a data storage system for implementing independent plane reads, the data storage system comprising: a memory controller for performing operations on one or more memory planes for storing data, the memory controller configured to perform the steps of: receiving a request to perform a first operation on a first plane; determining, for a second plane, whether a second plane timer having a respective amount of time has elapsed since initiation of a second operation being performed on the second plane, separate and distinct from the first plane; in response to a determination that the respective amount of time for the second plane timer has not elapsed: delay performing the first operation on the first plane until the respective amount of time associated with initiation of the second operation performed on the second plane has elapsed, and after delaying performance, performing the first operation on the first plane while the second operation continues to be performed on the second plane; and in response to a determination that the respective amount of time for the second plane timer has elapsed, performing the first operation on the first plane.

In some embodiments, the memory controller is further configured to perform the operation of: before performing the second operation on the second plane: determining a respective operational characteristic of the second operation to be performed on the second plane; and calculating the respective amount of time for the second plane timer based on the respective operational characteristic of the second operation to be performed on the second plane.

In some embodiments, the respective operational characteristic of the second operation is at least one of: memory characteristics, page combination characteristics and sensing operation characteristics of the respective plane.

In some embodiments, the operational characteristic is a memory characteristic that includes at least one of: program/erase cycle, data retention, cross-temperature, system temperature and read-disturb.

In some embodiments, the memory controller is further configured to perform the operation of: in response to initiating performance of the first operation on the first plane, initializing a first plane timer including a respective amount of time to perform the first operation on the first plane.

In some embodiments, the first plane and the second plane are connected to a same power source.

In some embodiments, the memory portion is at least one of: a plane, a die, a block, and a page.

BRIEF DESCRIPTION OF THE SEVERAL VIEWS OF THE DRAWINGS

The foregoing summary, as well as the following detailed description of embodiments of the disclosed invention, will be better understood when read in conjunction with the appended drawings of an exemplary embodiment. It should be understood, however, that the invention is not limited to the precise arrangements and instrumentalities shown.

In the drawings.

DETAILED DESCRIPTION

Spikes in peak/average power and/or an elevated bit error rate (BER) negatively impact the reliability and desirability of a storage device. Consequently, what is desired are mechanisms to perform independent plane reads with improved performance speeds while also limiting bit error rate and spikes in peak power or average power.

Numerous details are described herein to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

Figure 1:
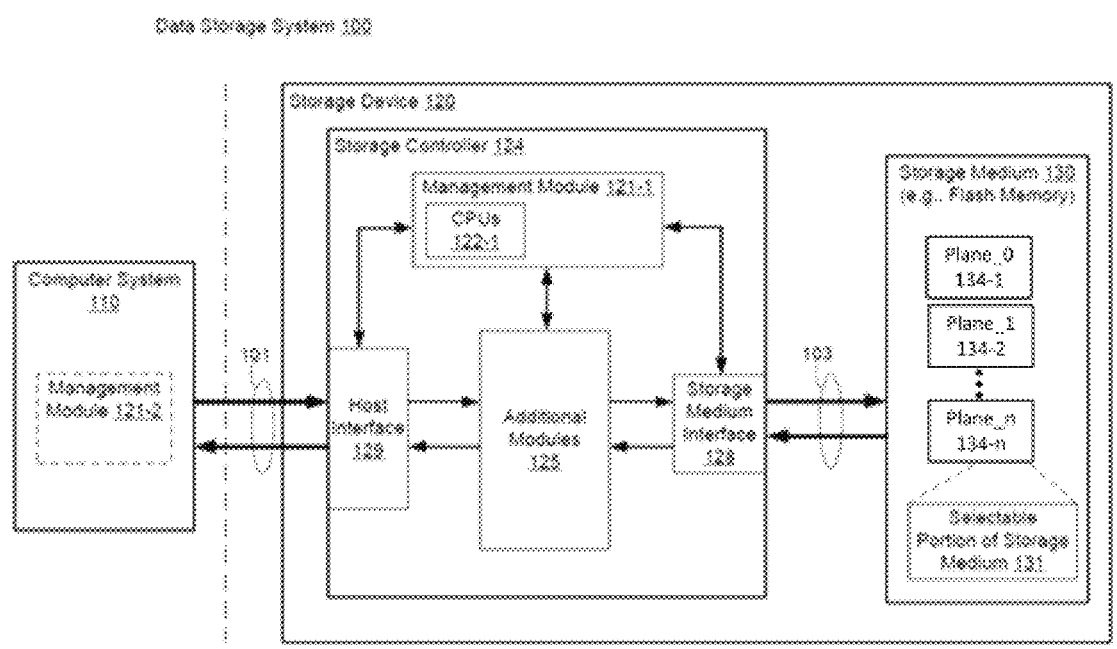
FIG. 1 is a block diagram illustrating an implementation of a data storage system, in accordance with some embodiments.

Referring to FIG. 1, there is shown a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes referred to herein as an information storage device, a data storage device, a non-volatile memory device, or a memory device), which includes a storage controller 124 and a storage medium 130, and is used in conjunction with or includes a computer system 110 (e.g., a host system or a host computer). In some embodiments, storage medium 130 is a single memory device while in other embodiments storage medium 130 includes a plurality of memory devices. In some embodiments, storage medium 130 is NAND-type memory or NOR-type memory. In some embodiments, storage medium 130 includes one or more three-dimensional (3D) memory devices. In some embodiments, the memory cells of storage medium 130 are configured to store two, three, or more bits per memory cell. Further, in some embodiments, storage controller 124 is a solid-state drive (SSD) controller. However, other types of storage media may be included in accordance with aspects of a wide variety of embodiments (e.g., Phase Change Random-Access Memory (PCRAM), Resistive Random Access Memory (ReRAM), Spin-Transfer Torque Random-Access Memory (STT-RAM), Magnetoresistive Random-Access Memory (MRAM), etc.). In some embodiments, a memory device includes one or more memory die, one or more memory packages, one or more memory channels or the like. In some embodiments, data storage system 100 includes one or more storage devices 120.

Computer system 110 is coupled to storage controller 124 through data connections 101. However, in some embodiments computer system 110 includes storage controller 124, or a portion of storage controller 124, as a component and/or as a subsystem. For example, in some embodiments, some or all of the functionality of storage controller 124 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display and/or other user interface components such as a keyboard, a touch-screen display, a mouse, a track-pad, a digital camera, and/or any number of supplemental I/O devices to add functionality to computer system 110. In some embodiments, computer system 110 does not have a display and other user interface components.

Storage medium 130 is coupled to storage controller 124 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 124 and storage medium 130 are included in the same device (i.e., an integrated device) as components thereof. Furthermore, in some embodiments, storage controller 124 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices 134-$i$ including, without limitation, persistent memory or non-volatile semiconductor memory devices, such as flash memory device(s). For example, memory device(s) can be configured for enterprise storage suitable for applications such as cloud computing, for database applications, primary and/or secondary storage, or for caching data stored (or to be stored) in secondary storage, such as hard disk drives. Additionally, and/or alternatively, memory device(s) can also be configured for relatively smaller-scale applications such as personal drives or hard-disk replacements for personal, laptop, and tablet computers. In some embodiments, each memory device 134-$i$ is a single 3D persistent memory or non-volatile semiconductor memory die, that includes multiple erase blocks (e.g., arrays 302, FIG. 3, sometimes simply called "blocks"), which are the minimum size erasable units in those memory devices. In some embodiments, the erase blocks in a respective memory device 134-$i$ are located in two separate planes, and more generally in n separate planes, where n is an integer greater than one. For example, in some such embodiments, each plane of the respective memory device 134-$i$ includes N blocks, where N is an integer greater than 1, and typically is greater than 15, 63, or 99.

Memory devices 134-$i$ of storage medium 130 include addressable and individually selectable blocks, such as selectable portion 131 of storage medium 130 (also referred to herein as selected portion 131). In some embodiments, the individually selectable blocks (sometimes called erase blocks) are the minimum size erasable units in a memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for writing data to or reading data from the memory device.

In some embodiments, storage controller 124 includes a management module 121-1, a host interface 129, a storage medium interface 128, and additional module(s) 125. Storage controller 124 may include various additional features that have not been illustrated for the sake of brevity and so as not to obscure pertinent features of the example embodiments disclosed herein, and a different arrangement of features may be possible. Host interface 129 provides an interface to computer system 110 through data connections 101. Host interface 129 typically includes an input buffer and output buffer, not shown. Similarly, storage medium Interface 128 provides an interface to storage medium 130 though connections 103. In some embodiments, storage medium Interface 128 includes read and write circuitry, including circuitry capable of providing reading signals to storage medium 130 (e.g., reading threshold voltages for NAND-type memory).

In some embodiments, management module 121-1 includes one or more processing units 122-1 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 122-1 are shared by one or more components within, and in some cases, beyond the function of storage controller 124. Management module 121-1 is coupled to host interface 129, additional module(s) 125 and storage medium Interface 128 in order to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

In some embodiments, additional module(s) 125 include an error control module, provided to limit the number of uncorrectable errors inadvertently introduced into data during writes to memory or reads from memory. In some embodiments, the error control module is executed in software by the one or more CPUs 122-1 of management module 121-1, and, in other embodiments, the error control module is implemented in whole or in part using special purpose circuitry to perform data encoding and decoding functions. To that end, in some embodiments, the error control module includes an encoder and a decoder. The encoder encodes data by applying an error control code to produce a codeword, which is subsequently stored in storage medium 130.

When the encoded data (e.g., one or more codewords) is read from storage medium 130, the decoder applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

The storage controller 124 is configured to perform sensing operations (e.g., read operations or also referred to herein as independent plane reads (IPR)). A read operation is initiated when computer system (host) 110 sends one or more host read commands (e.g., via data connections 101) to storage controller 124 requesting data from one or more planes 134-i of storage medium 130. Storage controller 124 sends one or more read access commands to storage medium 130, via storage medium interface 128, to obtain raw read data in accordance with memory locations (addresses at specific planes) specified by the one or more host read commands. Storage medium interface 128 provides the raw read data (e.g., comprising one or more codewords) to the decoder. If the decoding is successful, the decoded data is provided to an output buffer, where the decoded data is made available to computer system 110. In some embodiments, if the decoding is not successful, storage controller 120 may resort to a number of remedial actions or provide an indication of an irresolvable error condition.

The storage medium 130 may be configured to read data from one or more cells at one or more planes 134-i. For example, the storage medium 130 may include a sense amplifier circuit coupled to a bitline of a memory array, which in turn is coupled to an associated memory cell of a plane 134-i. During a portion of the read operation, electrical current may be transmitted through the memory cell to facilitate a sensing operation by the sense amplifier circuit to read data from the memory cell. For example, the sense amplifier circuit may be configured to sense the amount of current being drawn through the bitline to the memory cell to identify a state of the memory cell (e.g., on-cell or off-cell), and in turn, identify a data bit having a certain logic level (e.g., logic 0 level or a logic 1 level) stored at the memory cell. However, while the electrical current is being transmitted during a sensing operation, electrical noise is generated at the respective plane 134-i. This electrical noise may affect other sensing operations on other planes. Implementations to mitigate the effect of this electrical noise on other sensing operations on other planes are described in more detail below.

Figure 2:
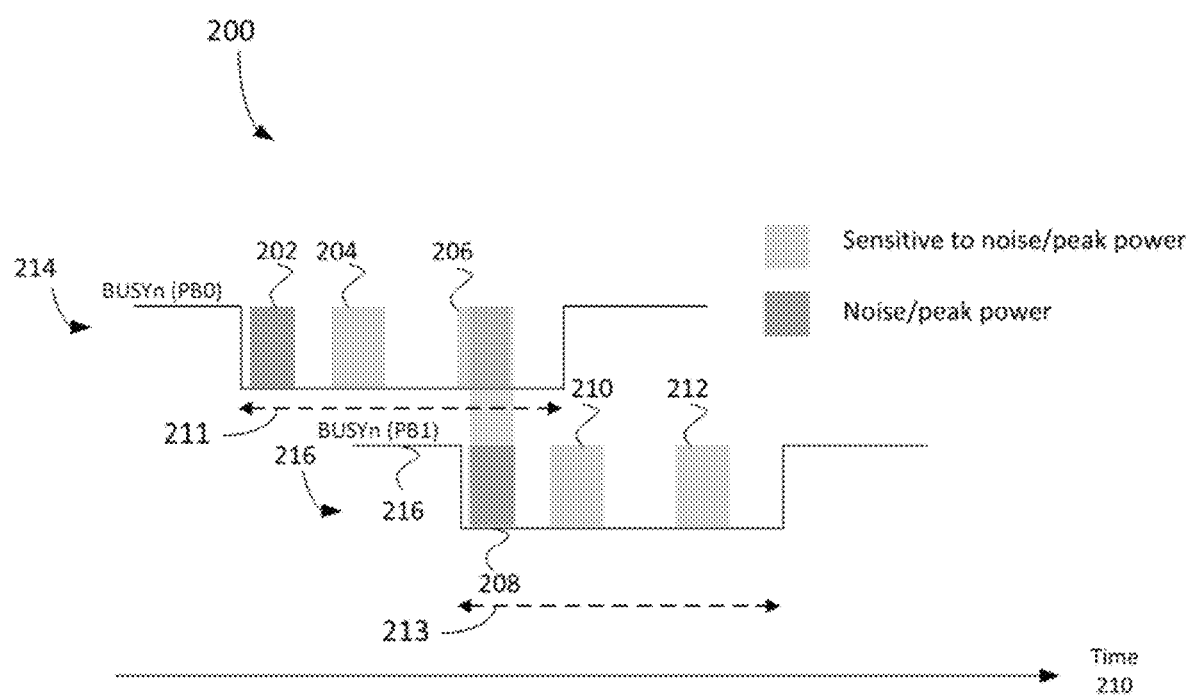
FIG. 2 is a timing diagram illustrating an asynchronous sensing operation in accordance with an exemplary embodiment of the present invention.

FIG. 2 shows a timing diagram 200 illustrating asynchronous sensing operations at respective planes 134-0, 134-1 (also referred to in the Figures as planes PB0 and PB1, respectively) of storage medium 130 located on the same die. The timing diagram 200 includes a horizontal axis representing time 210. Sensing operation time periods 211, 213 for respective planes PB0, PB1 are shown representing the time period from initiation of the sensing operation to completion of the sensing operation at the respective planes PB0, PB1. The timing diagram 200 includes a vertical axis 214, 216 representing a busy/not busy state for each the respective planes PB0, PB1. The sensing operation time period 211 for plane PB0 may include noisy time period 202 and sensitive time periods 204, 206. The sensing operation time period 213 for plane PB1 may include noisy time period 208 and sensitive time periods 210, 212.

During a noisy time period, planes PB0, PB1 may produce an electromagnetic signal that generates electromagnetic noise via a common power source or power line connecting the planes PB0, PB1, that may interfere with operations of the other respective plane and cause an increase in BER should the noisy time period of one plane overlap with a sensitive time period of another plane. For example, as shown in FIG. 2, plane PB1 may produce an electromagnetic signal during a noisy period 208 that overlaps with sensitive time period 206 of plane PB0. As a result of the noisy electromagnetic signal being transmitted during the sensitive time period 206 for plane PB0, the BER for plane PB0 would increase thereby causing an undesirable reduction in performance of the data storage system 100.

The electromagnetic signal may also cause an undesirable spike of peak power or average power if the electromagnetic signal is transmitted from plane PB0 while a similar electromagnetic signal is also being transmitted from a separate plane, such as plane PB1. This scenario may occur when noisy periods overlap, such as if noisy period 202 of the sensing operation for plane PB0 overlapped with noisy period 208 of the sensing operation for plane PB1.

Figure 3:
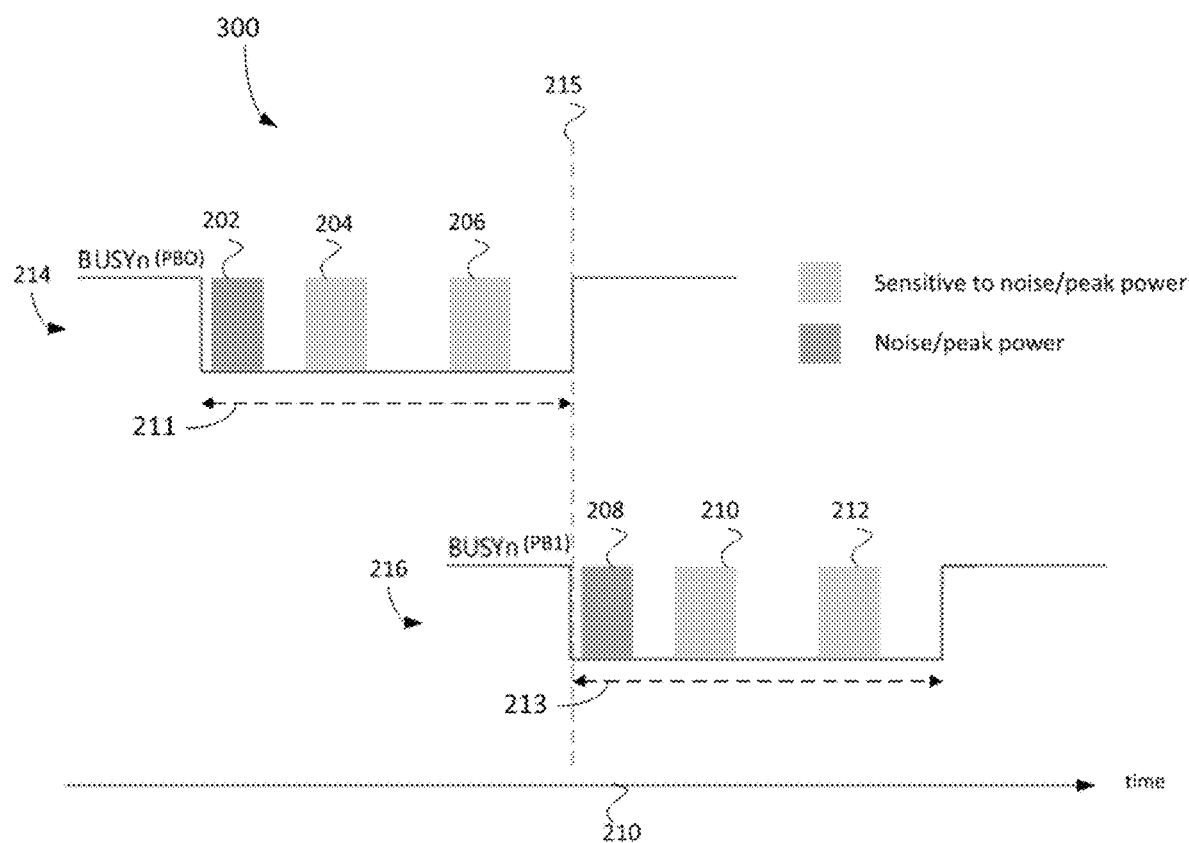
FIG. 3 is a timing diagram illustrating a synchronous sensing operation, in accordance with an exemplary embodiment of the present invention.

FIG. 3 shows a timing diagram 300 illustrating a synchronous IPR at respective planes PB0, PB1 of storage medium 130. FIG. 3 is substantially similar to FIG. 2, except the sensing operation time periods 211, 213 are synchronous. Synchronous operation may include synchronizing the IPRs based on an independent clock cycle that is substantially consistent through the life of the data storage system 100, absent human intervention. In some embodiments, sensing operation time periods 211, 213 are synchronous when sensing operation time period 211 and 213 are sequentially initiated and completed based on the same clock cycle, such that sensing operation time period 213 is not initiated until sensing operation time period 211 is completed. When the sensing operation time periods are synchronous, the noisy time periods 202, 208 do not overlap with sensitive time periods 204, 206, 210 and 212. Therefore, BER and spikes in peak/average power can be minimized. However, as mentioned herein, the performance speed for synchronous sensing operations may be undesirably slower as compared to asynchronous sensing.

Figure 4:
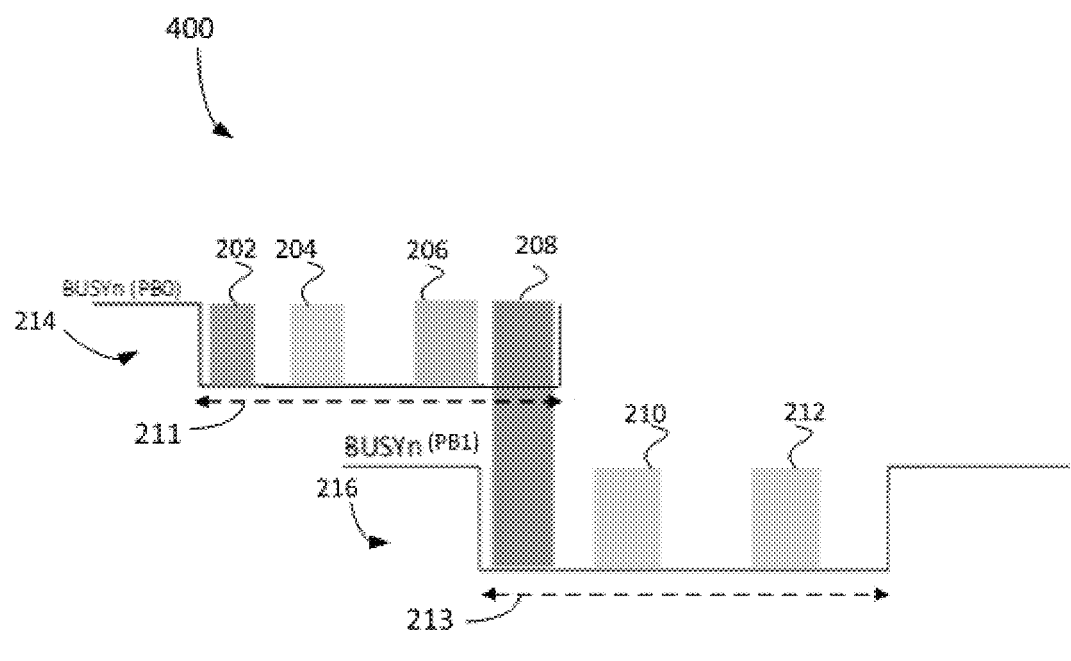
FIG. 4 is a timing diagram illustrating asynchronous independent plane read (aIPR) delay management through system plane timers, in accordance with an exemplary embodiment of the present invention.
Figure 4:

FIG. 4 shows a timing diagram 400 illustrating aIPR delay management through the use of plane timers to delay and stagger the sensing operations for planes PB0, PB1. FIG. 4 is substantially similar to FIGS. 2-3, except the sensing operation time periods 211, 213 are asynchronous and staggered such that, while there is overlap between sensing operation time periods 211, 213, there is no overlap between noisy time periods and sensitive time periods for the two different planes PB0, PB1.

To implement this improved asynchronous functionality, in some embodiments, the storage controller 124 may include plane timers for each plane PB0, PB1. For example, in some embodiment, in response to receiving a request to perform a sensing operation on plane PB0, in addition to initiating a corresponding sensing operation, the storage controller 124 may initialize a plane timer for plane PB0 indicating when a noisy time period 202 and/or a sensitive time period 204, 206 may occur. In some embodiments, to initialize the plane timer for PB0, the storage controller 124 may determine an operational characteristic (e.g., memory characteristics, page combination characteristics and sensing characteristics) associated with the initial operation to be performed on the plane PB0. The storage controller 124 may then calculate an amount of time for the plane timer based on the operational characteristic.

In response to receiving a separate request to perform a sensing operation on plane PB1, the storage controller 124 may determine whether another sensing operation is already occurring. This may be determined through an indication from the timer or sense amplifiers. If a sensing operation is already occurring, as described in this example, the storage controller 124 may delay the sensing operation for plane PB1 until the plane timer for plane PB0 has expired. After the plane time for plane PB0 has expired, the storage controller 124 may initiate the sensing operation for plane PB1. As a result of the asynchronous delay using plane timers, the noisy time period 208 for plane PB1 may occur after the sensitive time period 206 to minimize system performance issues (e.g., BER) as described herein while also occurring earlier than in a synchronous operation.

The time period for the plane timers may be variable and based on a respective operational characteristic of at least one of: memory characteristics, page combination characteristics and sensing characteristics of the respective plane. Examples of memory characteristics may include program/erase cycle, data retention, cross-temperature, system temperature and read-disturb. Program/erase cycle may refer to a sequence of events in which data is written to a smemory cell, then erased and then rewritten. Data retention may refer to one or more operations performed to retain data stored in one or more memory cells. Cross temperature (i.e. X-temp) may refer to a temperature range or temperature swing between data programing at a memory cell and reading at the memory cell. System temperature may refer to a temperature of the computing system 110 during a sensing operation. Read disturb may refer to the change in data stored in a memory cell as a result of a read operation being performed on a nearby memory cell. Examples of page combination characteristics may include single level cell (SLC) page, or lower page, middle page, upper page for multi-level cells. Examples sensing characteristics may include first read, normal read, Vreak spike and data look ahead. By varying the time period for the plane timers, the data storage system 100 can adjust independent sensing operations to maximize speed while reducing undesirable overlap of noisy time periods and/or sensitive time periods between respective planes.

Figure 5:
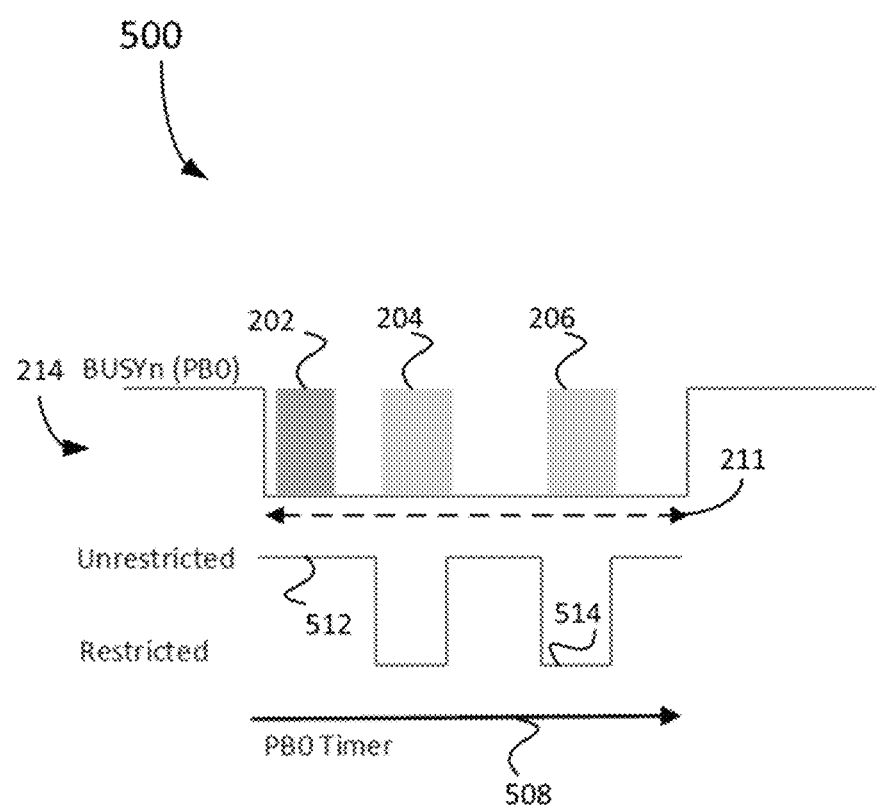
FIG. 5 is a timing diagram illustrating a sensing operation on a first plane, in accordance with an exemplary embodiment of the present invention.

FIG. 5 shows a timing diagram 500 illustrating timing for a sensing operation on plane PB0 and timing of the corresponding plane timer for plane PB0. The representation of sensing operation on plane PB0 is substantially similar to the representation of sensing operation on plane PB0 in FIGS. 2-4. As shown in FIG. 5, plane PB0 may also have a timer 508. In some embodiments, the timer 508 may be a countdown timer. In some embodiments, the timer 508 may be a software implementation. In other embodiments, the timer 508 may be a hardware implementation. In one embodiment, the timer 508 may have an unrestricted timer value 512 and a restricted time value 514. While the timer 508 has a restricted timer value 514, a sense operation on another plane, such as plane PB1, may be delayed until the timer 508 transitions to the unrestricted timer value 512. While the timer 508 has an unrestricted timer value 512, a sense operation on plane PB1 may be performed. In other words, prior to issuing a sense to a plane, such as plane PB1, the timer 508 for the plane PB0 may be checked by storage controller 124 to determine whether to delay the sensing operation or perform the sensing operation.

Figure 6:
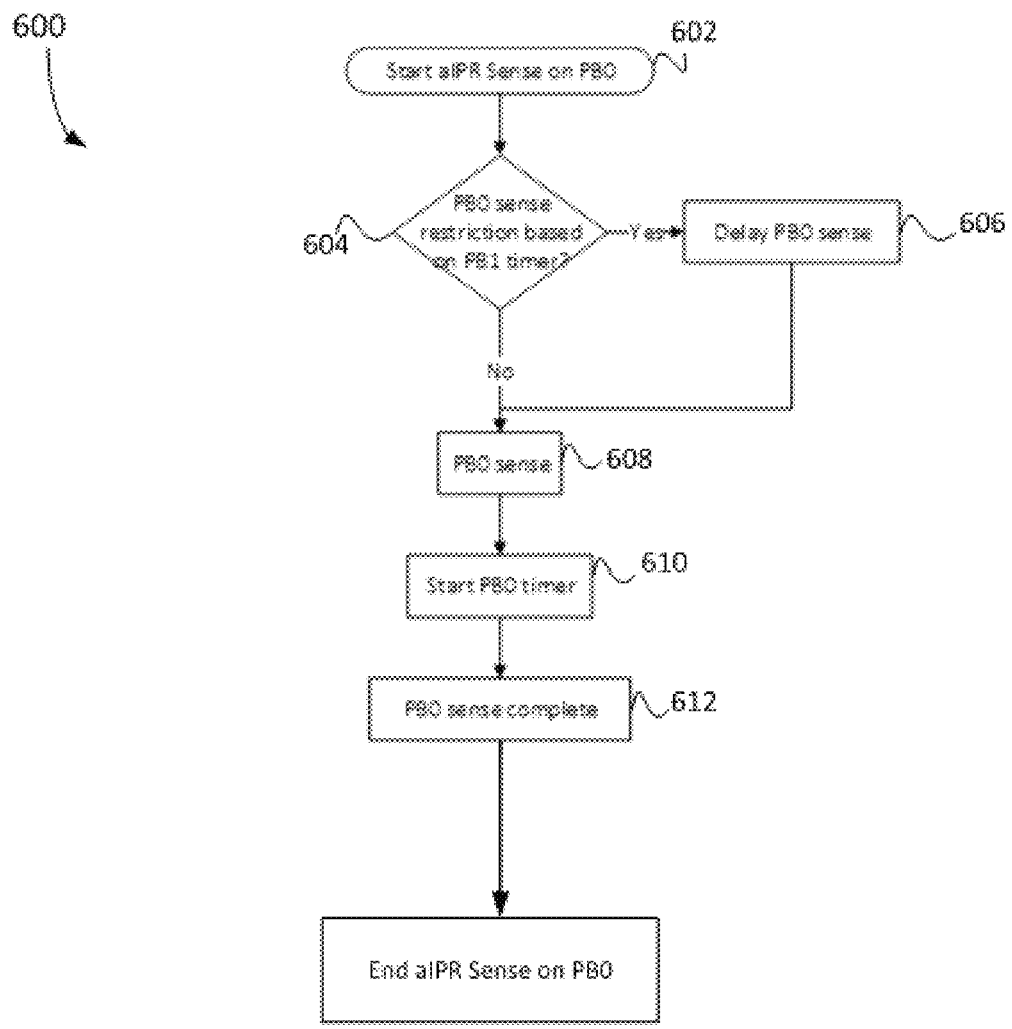
FIG. 6 is a flowchart illustrating aIPR delay management, in accordance with an exemplary embodiment of the present invention.

FIG. 6 illustrates a flowchart representation of a method 600 for aIPR delay management, in accordance with some embodiments. In one embodiment, the method 600 of aIPR delay management includes a method for implementing independent plane reads at a storage device (e.g., data storage system 110) that includes a plurality of memory planes for storing data and a controller system (e.g. storage controller 124) for performing operations on the memory planes, improving performance speeds and reducing BER and spikes in peak/average power. This will now be described in more detail.

In some embodiments, the method 600 includes, at the controller system, initially receiving (602) a request to start a first operation on a first plane (e.g., FIGS. 2-4, plane (PB1)). For example, as shown in FIG. 6, a request to start an aIPR sensing operation on plane PB1 may be received. In some embodiments, the first operation may be a sensing operation, as described herein.

The method 600 may include determining (604), for a second plane (e.g., FIGS. 2-4, second plane (PB1)), whether a second plane timer, having a respective predetermined amount of time, has elapsed since initiation of a second operation being performed on the second plane. In one embodiment, the respective predetermined amount of time for the second plane timer may be based on a respective characteristic of the second operation being performed on the second plane, as discussed herein.

The method 600 may include, in response to a determination that the respective predetermined amount of time for the second plane timer has not elapsed, delay (606) performing the first operation on the first plane until the respective predetermined amount of time associated with initiation of the second operation performed on the second plane has elapsed. The method 600 may include, in response to delaying performing the first operation on the first plane until the respective predetermined amount of time associated with initiation of the second operation performed on the second plane has elapsed, or in response to a determination that the respective predetermined amount of time for the second plane timer has already elapsed, performing (608) the first operation on the first plane while the second operation continues to be performed on the second plane. As an example of the delaying (606) and performing (608) steps, in the adjustment shown from FIG. 2 to FIG. 4, plane PB1 is delayed before performing the sensing operation. As a result, the noisy period 208 of plane PB1 does not overlap with sensitive period 206 of plane PB0. This contrasts with FIG. 2, showing the independent plane read sensing operation before delay was implemented. In FIG. 2, the noisy period 208 of plane PB1 overlaps with the sensitive period 206 of plane PB0. As a result of avoiding overlap between the noisy and sensitive periods, the method 600 can improve performance speeds and reduce BER and spikes in peak/average power.

The method 600 may include, in response to a determination that the respective predetermined amount of time for the second plane timer has elapsed, initializing (610) the first plane time for the first operation on the first plane.

The method 600 may include, when the first plane timer elapses, completing (612) the first operation on the first plane.

In some embodiments, the method 600 may be implemented on three or more planes. In some embodiments, the method 600 may be implemented on N planes, where N is an integer greater than one. In some embodiments, rather than being implemented on planes, the method 600 may be implemented on one or more blocks, one or more pages, one or more dies and/or one or more other memory devices, or memory portions thereof.

In one embodiment, the system includes one or more computers having one or more processors and memory (e.g., one or more nonvolatile storage devices). In some embodiments, memory or computer readable storage medium of memory stores programs, modules and data structures, or a subset thereof for a processor to control and run the various systems and methods disclosed herein. In one embodiment, a non-transitory computer readable storage medium having stored thereon computer-executable instructions which, when executed by a processor, perform one or more of the methods disclosed herein.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

We claim:

1. A method for calculating a timer at a storage device including a plurality of memory portions for storing data and a memory controller for performing operations on the memory portions, the method comprising:
   receiving a request to perform an initial operation on a memory portion;
   determining an operational characteristic associated with the initial operation to be performed on the memory portion; and
   calculating an amount of time for a memory portion timer based on the operational characteristic at initiation of the initial operation on the memory portion, wherein performance of a subsequent operation for another memory portion is delayed until the amount of time for the memory portion timer has elapsed since initiation of the operation on the memory portion.

2. The method of claim 1, wherein the operational characteristic includes at least one of: a memory characteristic, a page combination characteristic, and a sensing characteristic.

3. The method of claim 1, wherein the operational characteristic is a memory characteristic that includes at least one of: program/erase cycle, data retention, cross-temperature, system temperature and read-disturb.

4. The method of claim 1, wherein the operational characteristic is a page combination characteristic that includes at least one of: a single level cell page, multi-level cell (MLC) lower page, MLC middle page, and MLC upper page.

5. The method of claim 1, wherein the operational characteristic is a sensing characteristic that includes at least one of: first read, normal read, Vreak spike and data look ahead.

6. The method of claim 1, wherein a first time period for the performance of the initial operation on the memory portion overlaps with a second time period for the performance of a subsequent operation for another memory portion.

7. The method of claim 1, wherein the memory portion is at least one of: a plane, a die, a block, a page.

8. A memory controller for performing implementing independent memory portion read operations on one or more memory portions for storing data, the memory controller configured to perform the operations of:
   receiving a request to perform a first operation on a first memory portion;
   determining, for a second memory portion, whether a second memory portion timer having a respective amount of time has elapsed since initiation of a second operation being performed on the second memory portion, separate and distinct from the first memory portion;
   in response to a determination that the respective amount of time for the second memory portion timer has not elapsed:
   delay performing the first operation on the first memory portion until the respective amount of time associated with initiation of the second operation performed on the second memory portion has elapsed, and
   after delaying performance, performing the first operation on the first memory portion while the second operation continues to be performed on the second memory portion; and
   in response to a determination that the respective amount of time for the second memory portion timer has elapsed, performing the first operation on the first memory portion.

9. The memory controller of claim 8, wherein the memory controller is further configured to perform the operation of:
   before performing the second operation on the second memory portion:
   determining a respective operational characteristic of the second operation to be performed on the second memory portion; and
   calculating the respective amount of time for the second memory portion timer based on the respective operational characteristic of the second operation to be performed on the second memory portion.

10. The memory controller of claim 9, wherein the respective operational characteristic of the second operation is at least one of: memory characteristics, page combination characteristics and sensing operation characteristics of the respective memory portion.

11. The memory controller of claim 8, wherein the memory controller is further configured to perform the operation of:
 in response to performance of the first operation on the first memory portion, initializing a first memory portion timer including a respective amount of time to perform the first operation on the first memory portion.

12. The memory controller of claim 8, wherein the first memory portion and the second memory portion are connected to a same power source.

13. The memory controller of claim 8, wherein the first memory portion and the second memory portion are at least one of: a plane, a die, a block, and a page.

* * * * *